US010333063B1

(12) United States Patent
Kim et al.

(10) Patent No.: US 10,333,063 B1
(45) Date of Patent: Jun. 25, 2019

(54) FABRICATION OF A PERPENDICULAR MAGNETIC TUNNEL JUNCTION (PMTJ) USING BLOCK COPOLYMERS

(71) Applicant: Spin Memory, Inc., Fremont, CA (US)

(72) Inventors: Kuk-Hwan Kim, San Jose, CA (US); Dafna Beery, Palo Alto, CA (US); Amitay Levi, Cupertino, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/865,066

(22) Filed: Jan. 8, 2018

(51) Int. Cl.
| | |
|---|---|
| *H01L 43/12* | (2006.01) |
| *C08F 299/02* | (2006.01) |
| *C08L 83/04* | (2006.01) |
| *H01L 27/22* | (2006.01) |
| *C08G 77/12* | (2006.01) |
| *H01L 43/02* | (2006.01) |
| *C08L 83/10* | (2006.01) |

(52) U.S. Cl.
CPC .......... *H01L 43/12* (2013.01); *C08F 299/024* (2013.01); *C08G 77/12* (2013.01); *C08L 83/04* (2013.01); *C08L 83/10* (2013.01); *H01L 27/222* (2013.01); *H01L 43/02* (2013.01)

(58) Field of Classification Search
CPC ........ H01L 43/08; H01L 43/12; H01L 27/222
See application file for complete search history.

(56) References Cited

U.S. PATENT DOCUMENTS

| 8,168,449 | B2 | 5/2012 | Gaidis | |
|---|---|---|---|---|
| 10,186,551 | B1* | 1/2019 | Kim | H01L 27/228 |
| 10,192,984 | B1* | 1/2019 | Sharma | H01L 29/7831 |
| 2007/0212795 | A1* | 9/2007 | Milkove | H01L 21/02304 |
| | | | | 438/3 |
| 2011/0104827 | A1* | 5/2011 | Gaidis | B82Y 10/00 |
| | | | | 438/3 |

(Continued)

OTHER PUBLICATIONS

Lazzari et al., "Block Copolymers in Nanoscience," Wiley-VCH Verlag GmbH & Co. KGaA, Weinheim, 2006, 451 pages.

(Continued)

*Primary Examiner* — Jaehwan Oh
(74) *Attorney, Agent, or Firm* — Zilka-Kotab, P.C.

(57) ABSTRACT

According to one embodiment, a method includes forming an etch-stop layer above a substrate, forming a matrix layer above the etch-stop layer, forming a set of pillars above the matrix layer, the set of pillars having a predefined spacing therebetween along a plane in an element width direction and an element depth direction, the plane being normal to a film thickness direction, forming a functionalization layer above the pillars, along sides of the pillars, and above the matrix layer, forming first diblock copolymer layers above the functionalization layer, the first diblock copolymer layers self-segregating into a first polymer and a second polymer in a first pattern, removing the first polymer from the first diblock copolymer layers to create a first mask layer, and removing portions of the matrix layer to expose portions of the etch-stop layer positioned therebelow and create a second pattern in the matrix layer.

20 Claims, 13 Drawing Sheets

(56) References Cited

U.S. PATENT DOCUMENTS

| | | | |
|---|---|---|---|
| 2011/0248315 A1* | 10/2011 | Nam | B82Y 10/00 257/184 |
| 2013/0318483 A1* | 11/2013 | Chang | G06F 17/50 716/55 |

OTHER PUBLICATIONS

Hawker et al., "Block Copolymer Lithography: Merging 'Bottom-Up' with 'Top-Down' Processes," Materials Research Society Bulletin, vol. 30, Dec. 2005, pp. 952-966.

Tavakkoli et al., "Templating Three-Dimensional Self-Assembled Structures in Bilayer Block Copolymer Films," Advanced Materials, vol. 24, No. 31, Aug. 16, 2012, 21 pages.

Bao et al., "SRAM, NAND, DRAM Contact Hole Patterning using Block Copolymer Directed Self-assembly Guided by Small Topographical Templates," IEEE, 2011, pp. IEDM11-167-IEDM11-170.

Stoykovich et al., "Directed Self-Assembly of Block Copolymers for Nanolithography: Fabrication of Isolated Features and Essential Integrated Circuit Geometries," ACS Nano Article, vol. 1, No. 3, Oct. 6, 2007, pp. 168-175.

Kim et al., "Epitaxial self-assembly of block copolymers on lithographically defined nanopatterned substrates," Nature, vol. 424, Jul. 24, 2003, pp. 411-414.

Hellwig et al., "Bit patterned media based on block copolymer directed assembly Bit patterned media based on block copolymer directed assembly with narrow magnetic switching field distribution," Applied Physics Letters, vol. 96, Feb. 5, 2010, pp. 052511-1-052511-3.

Yi et al., "Flexible Control of Block Copolymer Directed Self-Assembly using Small, Topographical Templates: Potential Lithography Solution for Integrated Circuit Contact Hole Patterning," Advanced Materials, 2012, pp. 1-8.

Yi et al., "A General Design Strategy for Block Copolymer Directed Self-Assembly Patterning of Integrated Circuits Contact Holes using an Alphabet Approach," Nano Letters, 2015, pp. 805-812.

* cited by examiner

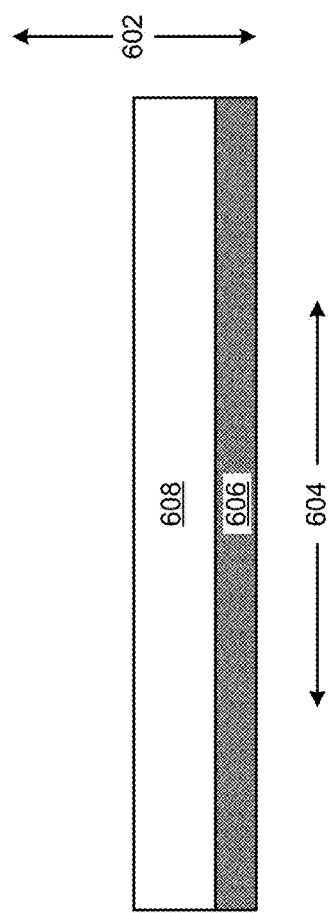

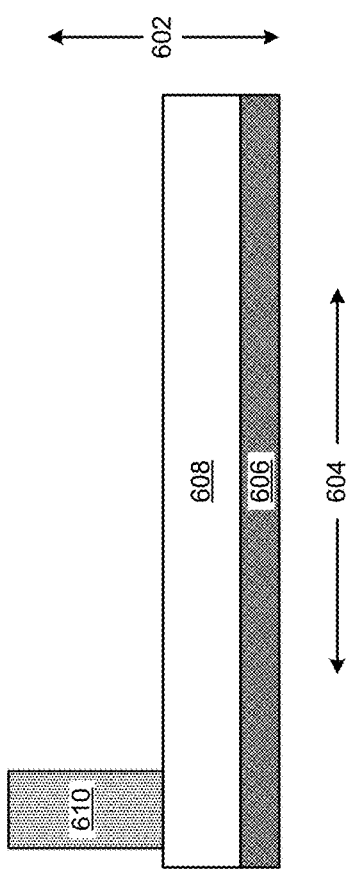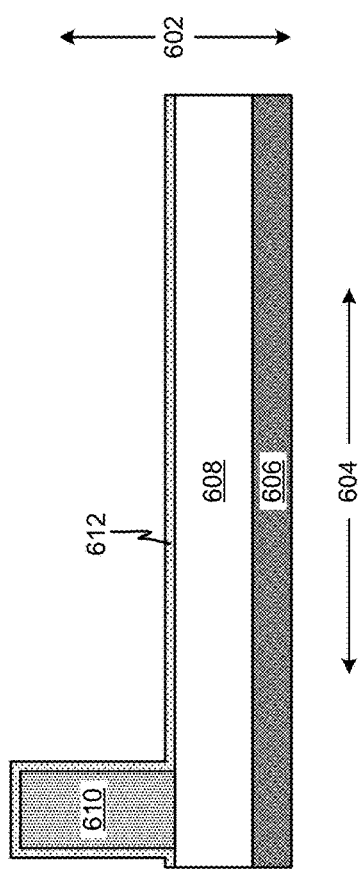

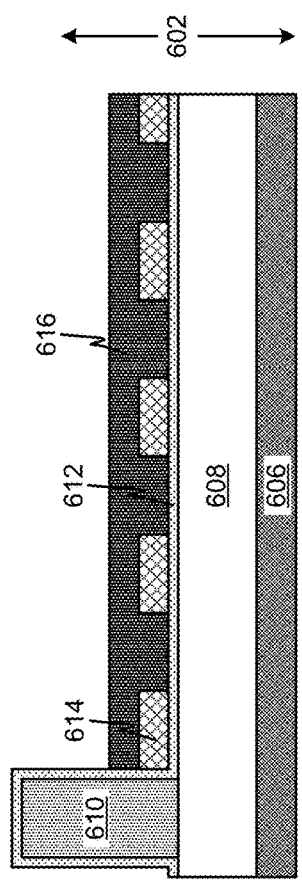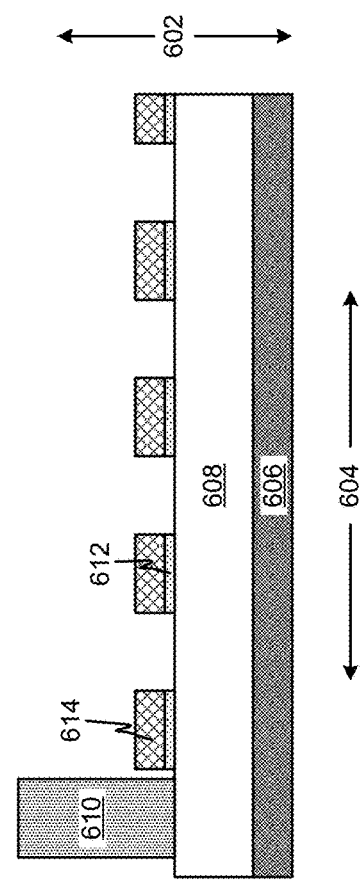

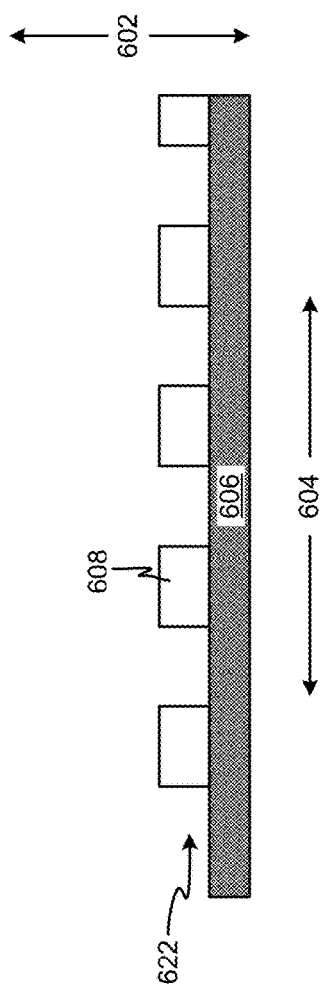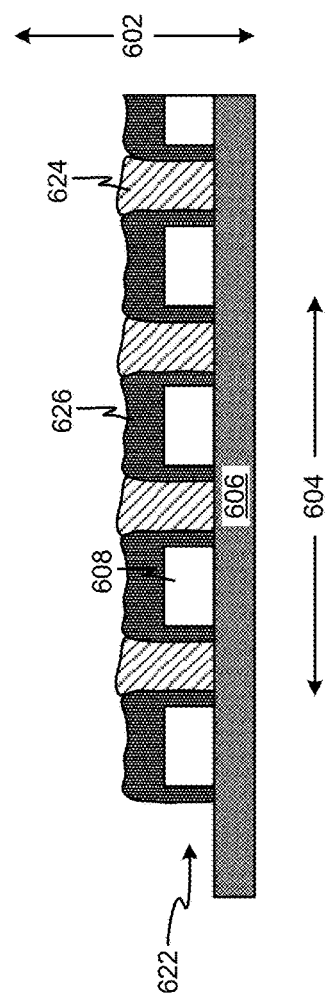

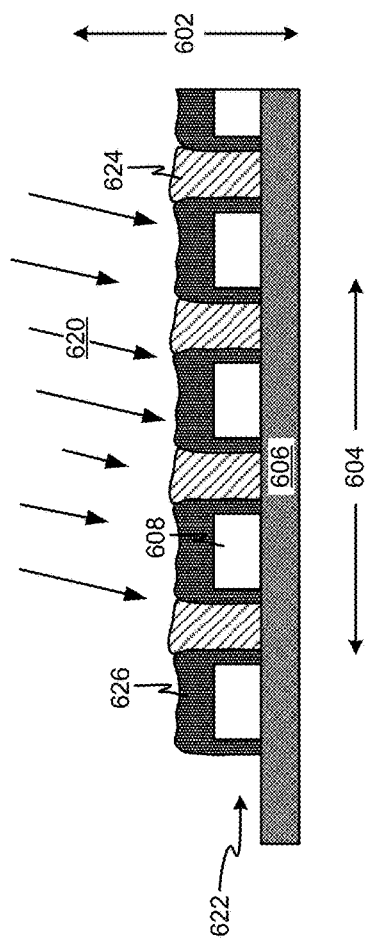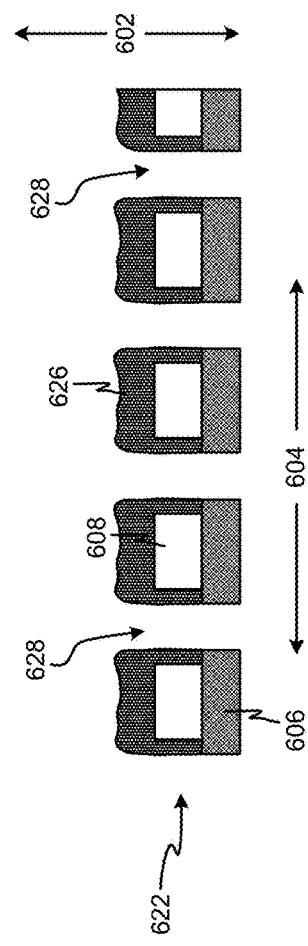

FABRICATION OF A PERPENDICULAR MAGNETIC TUNNEL JUNCTION (PMTJ) USING BLOCK COPOLYMERS

FIELD OF THE INVENTION

The present invention relates to magnetic random access memory (MRAM), and more particularly to manufacturing a perpendicular magnetic tunnel junction (pMTJ) using block copolymers.

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, removing the first polymer from the first diblock copolymer layers to create a first mask layer, and removing portions of the matrix layer that are not covered by the first mask layer in the film thickness direction to expose portions of the etch-stop layer positioned therebelow and create a second pattern in the matrix layer that forms a second mask layer.

In another embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, annealing the first diblock copolymer layers, removing the first polymer from the first diblock copolymer layers to create a first mask layer, removing the pillars, removing portions of the matrix layer that are not covered by the first mask layer in the film thickness direction to expose portions of the etch-stop layer positioned therebelow and create a second pattern in the matrix layer that forms a second mask layer, forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer, and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

In accordance with another embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, wherein the first diblock copolymer layers comprise poly(styrene-b-dimethylsiloxane) (PS-b-PDMS), the first polymer being PDMS, removing the first polymer from the first diblock copolymer layers to create a first mask layer, removing portions of the matrix layer that are not covered by the first mask layer in the film thickness direction to expose portions of the etch-stop layer positioned therebelow and create a second pattern in the matrix layer that forms a second mask layer, forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer, wherein the second diblock copolymer layers comprise poly(styrene-b-polymethyl methacrylate) (PS-b-PMMA), the third polymer being PS, and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

FIGS. 6A-6L show various structures created during manufacture of a pMTJ mask, in one embodiment.

DETAILED DESCRIPTION

Figure 1:
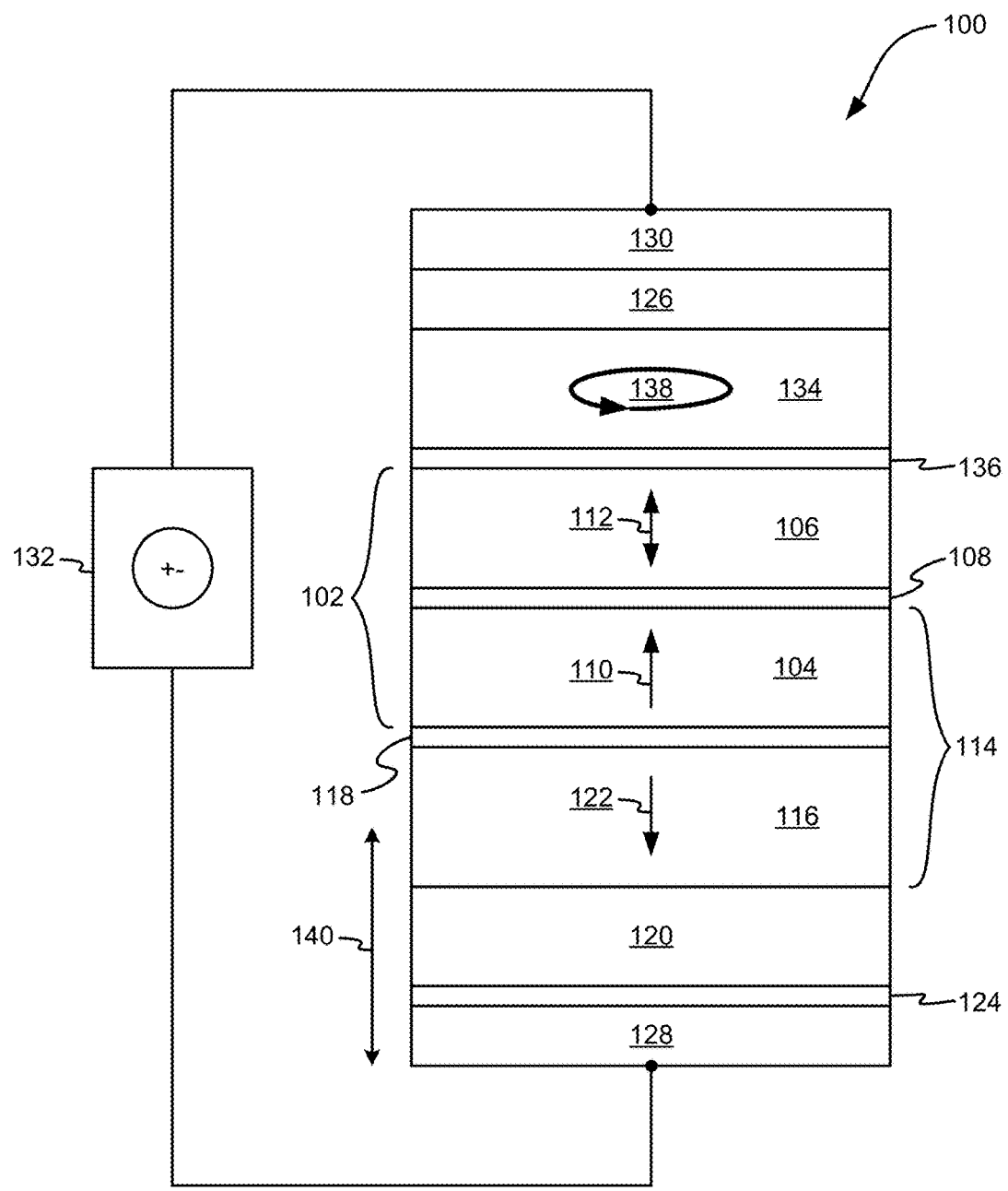
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, removing the first polymer from the first diblock copolymer layers to create a first mask layer, and removing portions of the matrix layer that are not covered by the first mask layer in the film thickness direction to expose portions of the etch-stop layer positioned therebelow and create a second pattern in the matrix layer that forms a second mask layer.

In another general embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, annealing the first diblock copolymer layers, removing the first polymer from the first diblock copolymer layers to create a first mask layer, removing the pillars, removing portions of the matrix layer that are not covered by the first mask layer in the film thickness direction to expose portions of the etch-stop layer positioned therebelow and create a second pattern in the matrix layer that forms a second mask layer, forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer, and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

In accordance with another general embodiment, a method includes forming an etch-stop layer above a substrate in a film thickness direction, forming a matrix layer above the etch-stop layer in the film thickness direction, forming a set of pillars above the matrix layer in the film thickness direction, the set of pillars having a predefined spacing therebetween along a plane in an element width direction and an element depth direction, the plane being normal to the film thickness direction, forming a functionalization layer above the pillars, along sides of the pillars, and above the matrix layer in the film thickness direction, forming first diblock copolymer layers above the functionalization layer in the film thickness direction, the first diblock copolymer layers self-segregating into a first polymer and a second polymer in a first pattern, wherein the first diblock copolymer layers comprise poly(styrene-b-dimethylsiloxane) (PS-b-PDMS), the first polymer being PDMS, removing the first polymer from the first diblock copolymer layers to create a first mask layer, removing portions of the matrix layer that are not covered by the first mask layer in the film thickness direction to expose portions of the etch-stop layer positioned therebelow and create a second pattern in the matrix layer that forms a second mask layer, forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer, wherein the second diblock copolymer layers comprise poly(styrene-b-polymethyl methacrylate) (PS-b-PMMA), the third polymer being PS, and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
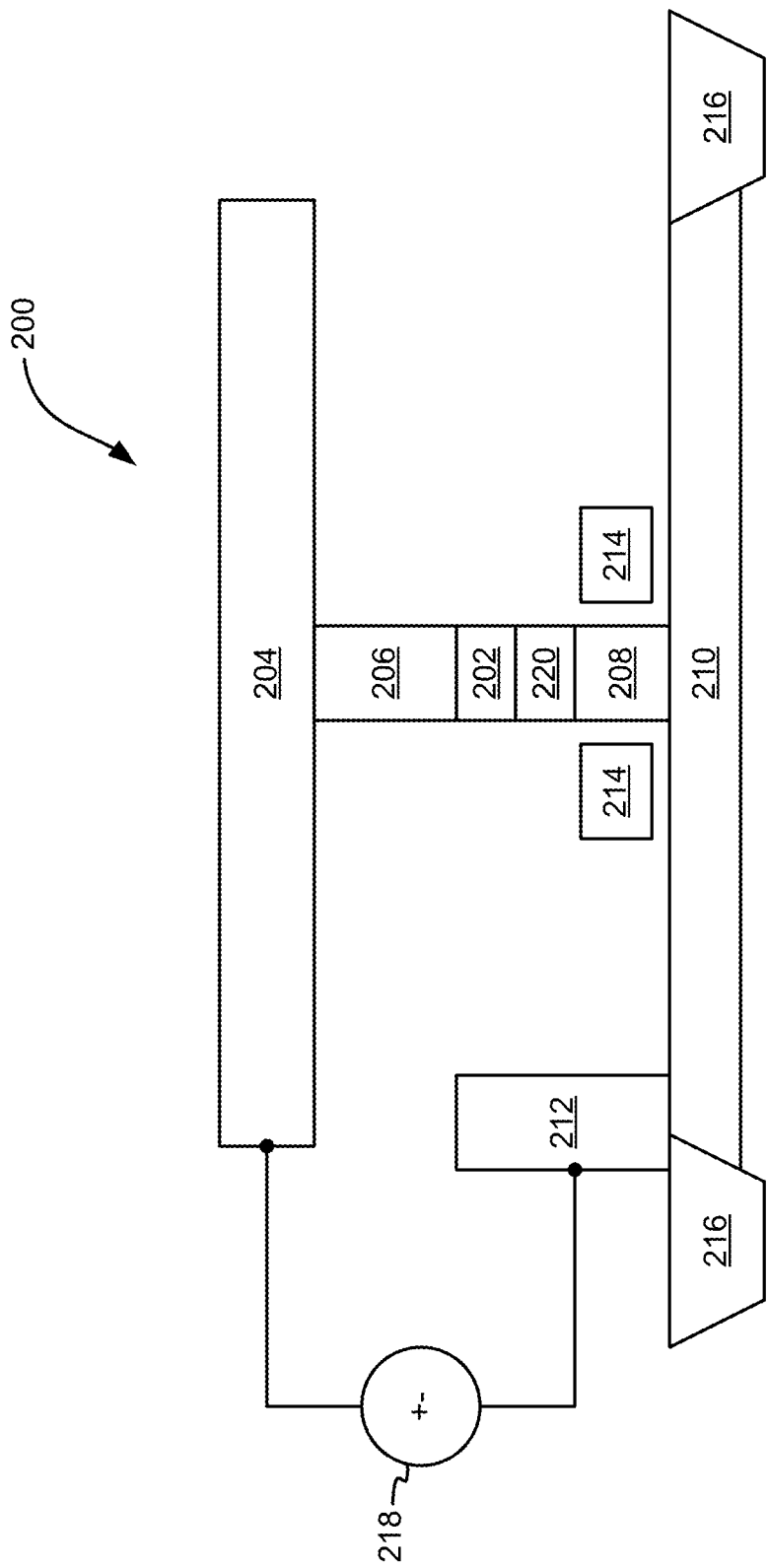
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

During the manufacture of a pMTJ, using conventional techniques, there is an issue where a diameter or cross-sectional area of the pMTJ varies, which contributes to broadening of a distribution of a minimum resistance ($R_{min}$) and a maximum resistance ($R_{max}$) for each pMTJ. In addition, variations in average resistance area product, etch profile, location-dependencies, etc. Given current lithography limitations, contact hole processing has stringent requirements, which are difficult to meet in order to provide a suitable mask for pMTJ stack processing.

In order to overcome these issues with conventional pMTJ stack processing, particularly conventional photolithographic limitations, block-copolymer lithography may be used in embodiments described herein.

By utilizing block copolymers to define a hard mask for defining pMTJ etch. Block copolymer processing may result in tight distribution of contact hole formation, enabling a thicker hard mask, sub-lithographic contact hole processing, and low-cost manufacturing as a result of these improved processes. In addition, in various approaches, using a self-assembled guide produced from a high-quality nanoimprint mask or block-copolymer, high-quality and precise template processing is made available for controlling the pMTJ stack formation.

A diblock copolymer has a structural characteristic of having two copolymer chains bonded together with one covalent bond between the different copolymers. Using phase separation, a unique microstructure may be formed (which allows for block-copolymer lithography). With directed block copolymer lithography with pattern multiplication, improvements to the cost of fabrication and process quality of lithography steps are possible, thereby providing for reliable memory operation when MRAM is constructed of the pMTJs.

Depending on a molecular fraction of a first polymer ($f_1$) versus a molecular fraction of a second polymer ($f_2$) in a diblock copolymer, the shape that the diblock copolymer takes on will change, ranging from spheres and cylinders of the first polymer suspended in a plurality of the second polymer when $f_1$ is low, to lamellae (alternating sheets of each polymer) when $f_1$ and $f_2$ are approximately equal, to spheres and cylinders of the second polymer suspended in a plurality of the first polymer when $f_1$ is high.

Figure 3:
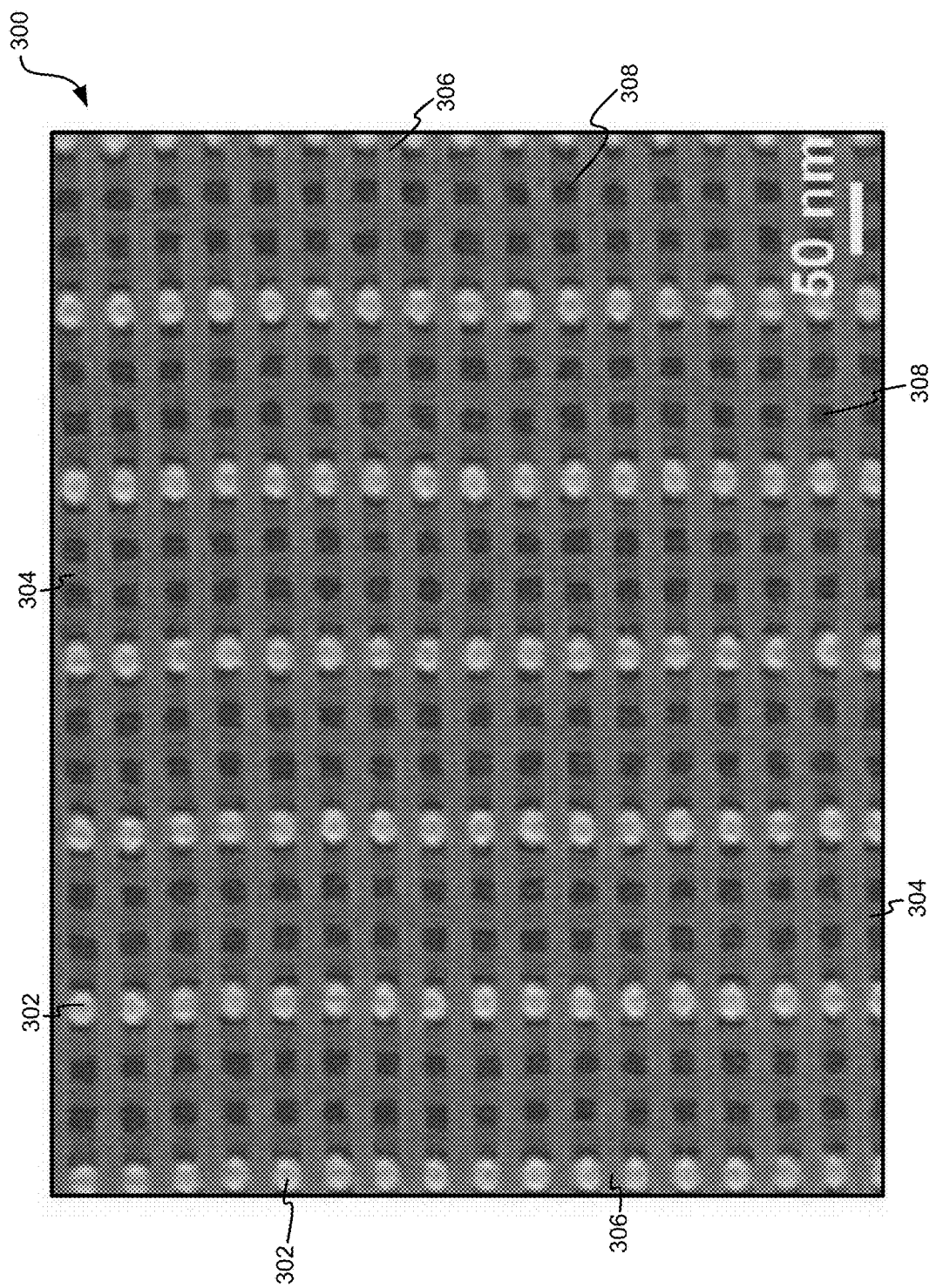
FIG. 3 shows a scanning electron microscope image of a mask for perpendicular magnetic tunnel junction (pMTJ) stack formation, in one embodiment.

With reference to FIG. 3, a scanning electron microscope image of a mask 300 for pMTJ stack formation is shown according to one embodiment. The mask 300 is formed above a substrate and comprises diblock copolymers that utilize pillars 302, which direct block copolymer self-assembly therefrom based on surface activation of the pillars 302 and substrate therebelow, such as via applying a thin layer of hydroxyl-terminated polystyrene (PS), e.g., 1 kg/mol with a thickness of 2 nm. The hydroxyl-terminated polystyrene functionalizes the surface of the pillars 302 and substrate to direct the self-assembly processes, such that subsequently formed PS-chains of the block copolymers are attracted to the pillars 302 and to the substrate at the same time.

Moreover, originating from and surrounding each of the pillars 302 are vertical chains 304 and horizontal chains 306 above the vertical chains 302 formed of the same polymer material. The horizontal chains 306 are formed in an upper area while the vertical chains 304 are formed in a lower area of the crisscrossing pattern shown in FIG. 3. Specifically, the vertical chains 304 and horizontal chains 306 are formed of a poly(dimethylsiloxane) (PDMS)-portion of block-copolymer chains that are formed of PS-b-PDMS block copolymers. In the voids 308 (which include any areas not occupied by the pillars 302, the vertical chains 304, or the horizontal chains 306, including in the lower area and the upper area), there was a PS-portion of the PDMS block copolymers, which has now been removed to form the voids 308, specifically via selective etching of the PS-chains.

In the embodiment shown in FIG. 3, the pillars 302 comprised hydrogen silsesquioxane (HSQ), but may comprise some other suitable material known in the art that is capable of acting as a pillar material for subsequent diblock copolymer mask formation. Moreover, the vertical chains 304 and horizontal chains 306 comprised poly(dimethylsiloxane) (PDMS), polymethyl methacrylate (PMMA), but may comprise some other suitable copolymer material that will form chains of desired length and thickness from the pillars 302. In addition, the voids 308 had therein, prior to removal, PS, but may have some other suitable sacrificial copolymer that can be covalently bonded to the vertical chains 304 and horizontal chains 306 to form the desired pattern.

Figure 4A:
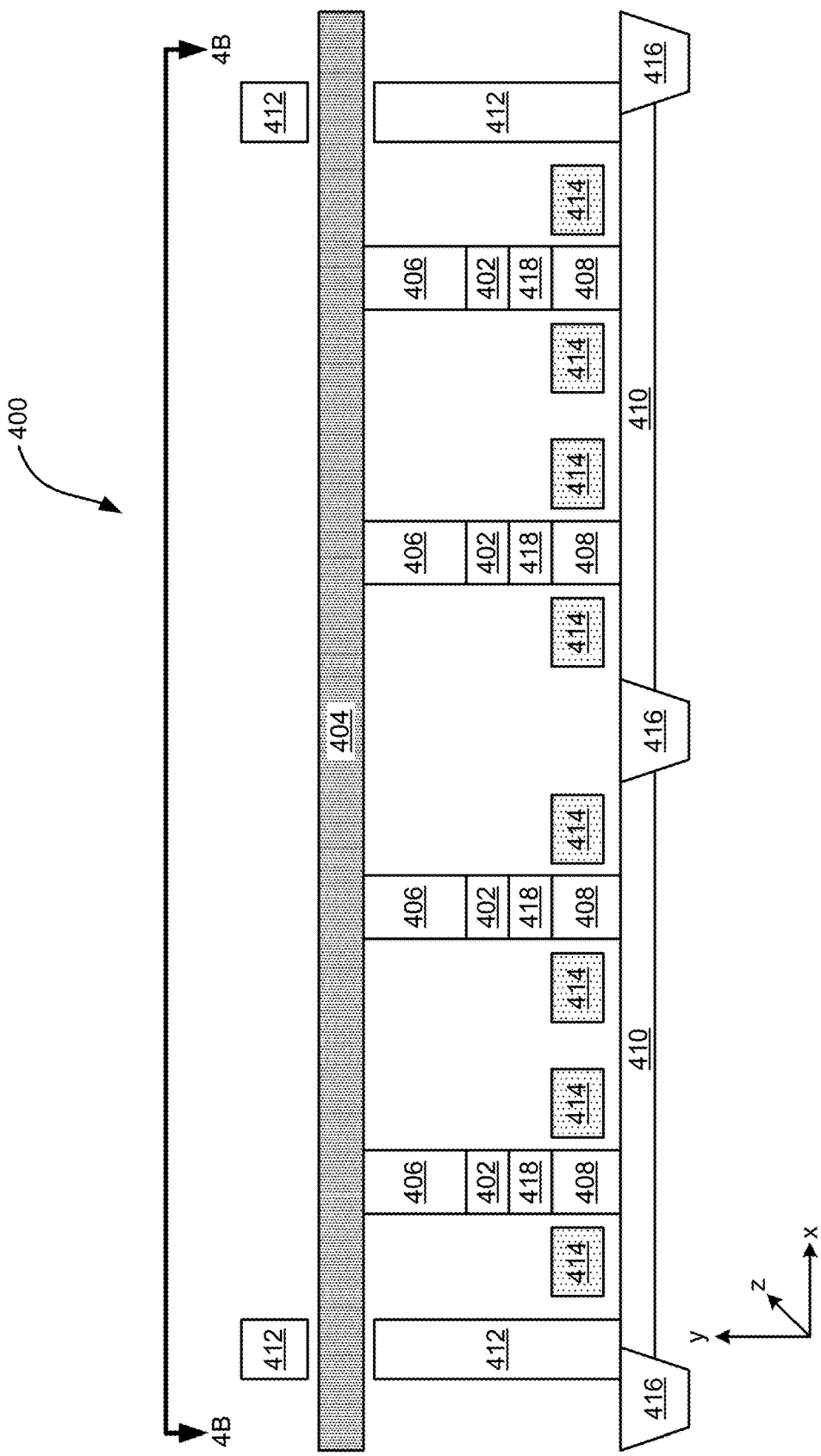
FIG. 4A shows a cross-sectional diagram of a portion of a MRAM structure that utilizes a shared source line contact array according to one embodiment.

Now referring to FIG. 4A, a cross-sectional diagram of a portion of a MRAM structure 400 that utilizes a shared source line contact array is shown according to one embodiment. This cross-sectional view is shown along a plane in the x-direction (also referred to as an element width direction) and the y-direction (also referred to as a film thickness direction). The MRAM structure 400 also includes a common bit line 404 (also referred to as a drain line in some descriptions) that supplies current across the pMTJs 402, e.g., from a current source (not shown). The common bit line 404 may include any suitable material known in the art, such as TaN, W, TiN, Au, Ag, Cu, etc. The pMTJ extension layers 406 electrically connect each of the pMTJs 402 with the common bit line 404. The extension layers 406 may include any suitable material known in the art, such as Ru, Ta, etc.

Each pMTJ 402 may comprise a seed layer, an underlayer positioned above the seed layer, a synthetic antiferromagnetic (SAF) seed layer positioned above the underlayer, a first SAF layer positioned above the SAF seed layer, a spacer layer positioned above the first SAF layer, an antiferromagnetic (AFM) coupling layer positioned above the spacer layer, a second SAF layer positioned above the AFM coupling layer, a ferromagnetic (FM) coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free positioned above the middle free layer. The pMTJs may also comprise a first cap layer positioned above the upper free layer, a second cap layer positioned above the first cap layer, a third cap layer positioned above the second cap layer, and a fourth cap layer positioned above the third cap layer.

According to one embodiment, the seed layer may be formed above a poly-crystalline layer that includes many grain boundaries, such as TaN. The seed layer may act to stop texture propagation from this poly-crystalline layer. Otherwise, the grain structure of the poly-crystalline layer may propagate upward in the structure. The seed layer may comprise Ta and/or a suitable material known in the art and may have a thickness of about 1 nm.

The underlayer may be used to facilitate recrystallization of the subsequently formed SAF layers during post-pMTJ annealing. It may comprise Ru and/or a suitable material known in the art and may have a thickness of about 3 nm.

The SAF seed layer may comprise Pt and/or a suitable material known in the art and may have a thickness of about 0.25 nm. It may be used to spur growth of the first SAF layer. The first SAF layer exhibits a strong perpendicular anisotropy field, and may comprise CoPt and/or a suitable material known in the art, with a thickness of about 1.5 nm. The spacer layer may comprise Co and/or a suitable material known in the art and may have a thickness of about 0.35 nm.

The AFM coupling layer may comprise Ru and/or a suitable material known in the art, with a thickness of about 0.85 nm. The AFM coupling layer is positioned between the first and second SAF layers to cause the second SAF layer to have antiferromagnetic coupling with the first SAF layer. The second SAF layer may comprise Co and/or a suitable material known in the art and may have a thickness of about 0.9 nm.

The FM coupling layer may comprise Mo and/or a suitable material known in the art, with a thickness of about 0.35 nm. The FM coupling layer may provide ferromagnetic-coupling between the second SAF layer and the reference layer.

The first reference layer may comprise CoFeB40 and/or a suitable material known in the art, with a thickness of about 0.5 nm, while the second reference layer may comprise CoFeB30 and/or a suitable material known in the art, with a thickness of about 0.3 nm. The reference layer has different compositions along the film thickness direction. In one embodiment, a higher Fe concentration is present in the second reference layer for more spin-polarized current, while a higher Co concentration is present in the first reference layer for better coupling with the second SAF layer.

The barrier layer may comprise MgO and/or a suitable material known in the art, with an average resistance area product of about RA=7. The barrier layer may be deposited using DC sputtering where metallic Mg is deposited and subsequently oxidized with oxygen in order to form MgO.

A wetting layer may be positioned above the barrier layer, in one embodiment. The wetting layer is a very thin layer which causes an upper surface of the MgO of the barrier layer to become sticky, thereby prohibiting island formation during subsequent CoFeB deposition of the lower free layer. This wetting layer may be deposited at a low temperature (about 100K) and comprise a few (e.g., three to one hundred) monolayers of Fe, in one approach.

The lower free layer may comprise CoFeB20 and/or a suitable material known in the art, with a thickness of about 1.4 nm. The middle free layer may comprise W and/or a suitable material known in the art, with a thickness of about 0.3 nm, and the upper free layer may comprise CoFeB20 and/or a suitable material known in the art, with a thickness of about 0.6 nm. The free layer is configured to flip magnetic orientation in the presence of spin-torque current. The W of the middle free layer blocks B diffusion through the middle free layer, while also gathering and trapping the B inside the W material.

The first cap layer may comprise MgO and/or a suitable material known in the art and may have an average resistance area product of about RA=1.0, the second cap layer may comprise CoFeB20 and/or a suitable material known in the art and may have a thickness of about 0.6 nm, the third cap layer may comprise Ta and/or a suitable material known in the art and may have a thickness of about 3 nm, and the fourth cap layer may comprise Ru and/or a suitable material known in the art and may have a thickness of about 10 nm. The collection of capping layers act to block metallic ion diffusion from above, and to resist pMTJ metallization. Ru is widely used to electrically extend the pMTJs 402 to another electrical terminal that may be positioned and/or formed above the pMTJs 402.

Moreover, a source terminal 418 is coupled between the pMTJs 402 and a channel layer 408, the channel layer 408 further being in electrical contact with a n+ common source layer 410. The channel layer 408 may include any suitable semiconductor material known in the art, such as Si, epi-Si, Ge, GaAs-compounds, etc. The n+ common source layer 410 may include any suitable material known in the art, such as phosphorous-doped silicon, arsenide-doped silicon, doped silicon cladded with TaN, W, TiN, Au, Ag, Cu, etc., and may be further electrically connected to a current source by a source line 412, which may include any suitable material known in the art, such as TaN, W, TiN, Au, Ag, Cu, etc. Positioned across the channel layer 408 is a common word line 414 which may include any suitable material known in the art, such as TaN, W, TiN, Au, Ag, Cu, etc. On either side of the n+ common source layer 410 are STI layers 416 which provide electrical insulation between adjacent n+ common source layers 410. Moreover, although not specifically shown, electrically insulative material may be positioned around the various layers shown in FIG. 4A, as would be understood by one of skill in the art.

It follows that the n+ common source layer 410 is shared across more than one of the cells (having at least one pMTJ 402 included therein), thereby acting as a common source line as seen in the various approaches described herein. Thus, the source layer 412 contact may be shared for plural access transistors, thereby effectively allowing for the cell layout in the MRAM structure 400 to be increased significantly, especially compared to conventional products. Moreover, disturbances which may be caused by sharing a source contact among memory cells may be minimized by employing a protective bias scheme in memory array operation, e.g., on a circuit level. The overarching transistor included in each of the memory cells may preferably be a vertical transistor which has a general cylindrical shape, e.g., as will be described in further detail below.

Moreover, the source terminal 418 that is included between the pMTJ 402 and the channel layer 408 may be for a transistor. In order to form a desirable terminal, the source terminal 418 preferably includes a material which has a substantial ohmic contact with target channel materials of the structure, which may include epi-Si, epi-SiGe, epi-Ge, nanocrystalline Si, laser-annealed recrystallized Si, etc. Accordingly, the source terminal 418 may include various silicide materials such as NiTi, TiSi, PtSi, CoSi or pure metallic component such as Ni, Ti, Au, Cr, Pt, etc. A drain terminal (not shown) of a vertical channel transistor may also be coupled to the n+ common source layer 410. Some approaches may further include multiple drain terminals connected to the n+ common source layer 410. Furthermore, in some approaches the common word line 414 may even function as a gate terminal of a transistor, e.g., as would be appreciated by one skilled in the art after reading the present descriptions. Moreover, although not specifically shown, electrically insulative material may be positioned around the various layers shown in FIG. 4A, as would be understood by one of skill in the art.

Defining a contact hole in the lateral y-direction is used to control positioning and sizing of the pMTJ 402 formed therein. Precise definition of these contact holes provides a host of benefits in terms of memory array scaling, including control of critical dimension(s) and providing reliable memory circuit operation (a sense margin is reduced in response to variation of geometrical dimensions for the pillar structure of the pMTJ 402).

Figure 4B:
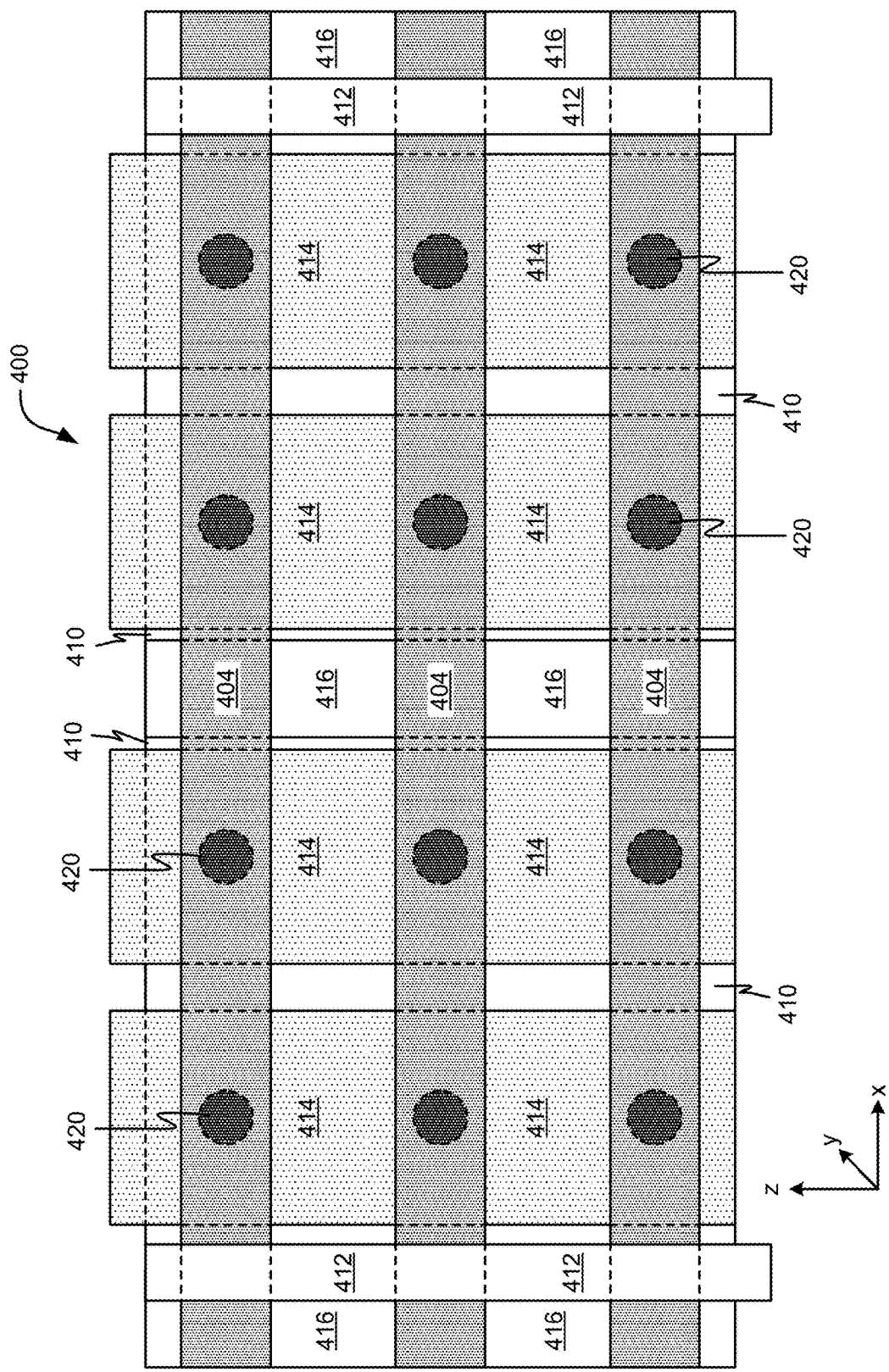
FIG. 4B shows a top-down view of the MRAM structure shown in FIG. 4A according to one embodiment.

Now referring to FIG. 4B, a top-down view of the MRAM structure 400 included in FIG. 4A is shown. In FIG. 4B, this top-down view is shown along a plane in the x-direction and the z-direction (also referred to as an element depth direction). As shown, the common bit lines 404 run along the rows of memory cells, the rows being identified by the plurality of contact hole masks 420. Moreover, the contact hole masks 420 are also shown as being oriented in columns along the word line masks 414. Source line masks 412 extend parallel to the word line masks 414 along the columns of memory cells. The STI layers 416 are shown below the common bit lines 404, also oriented parallel to the word line masks 414, and between the n+ common source layers 410.

The actual dimensions of the various components included in the top-down view of FIG. 4B may vary depending on the type of fabrication processes implemented when forming the MRAM structure 400. Moreover, although not specifically shown, electrically insulative material may be positioned around the various layers shown in FIG. 4B, as would be understood by one of skill in the art.

Figure 5:
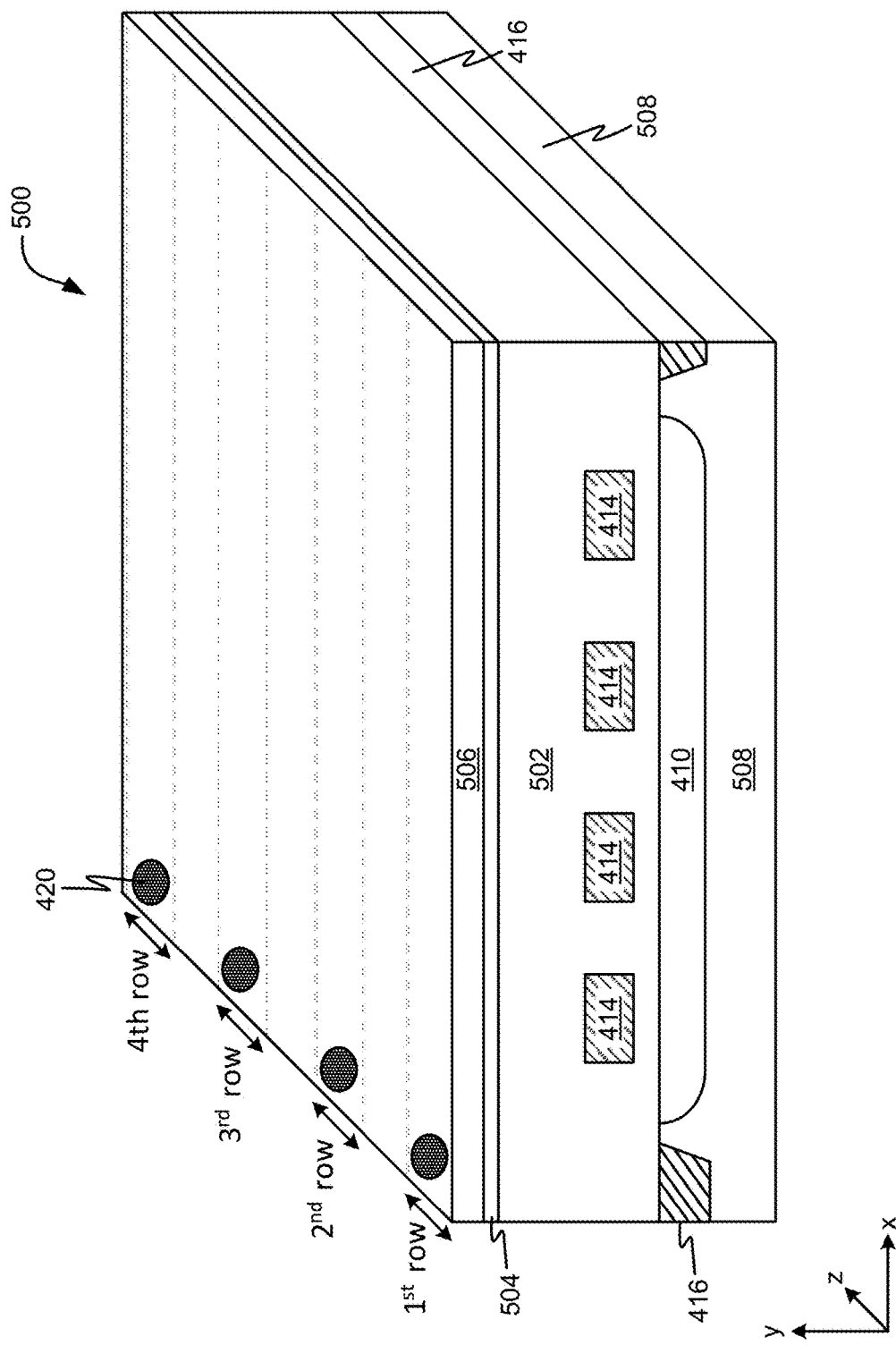
FIG. 5 shows an isometric view of a portion of a MRAM structure according to one embodiment.

With reference to FIG. 5, an isometric view of a portion of a MRAM structure 500 is shown according to one embodiment. As shown, the MRAM structure 500 includes the n+ common source layer 410 isolated on each side thereof in the x-direction by STI layers 416. These layers may be formed above a base substrate 508, which may comprise any suitable material for formation of layers thereabove. Positioned above the n+ common source layer 410 are a set of common word lines 414 which may be formed prior to formation of the pMTJ stacks, in one embodiment. The set of common word lines 414 are positioned in a prefabrication structure 502 that comprises a suitable material known in the art.

According to one embodiment, an etch-stop layer 504 is formed above the prefabrication structure 502 in the y-direction (also referred to as the film thickness direction), followed by formation of a matrix layer 506 thereabove in the film thickness direction. The etch-stop layer 504 may comprise any suitable material known in the art, including oxides, nitrides, etc. The matrix layer 506 may comprise any suitable material known in the art, including amorphous silicon (α-Si) in one embodiment.

The placement of the contact hole masks 420 are indicated above the matrix layer 506, and noted by the individual rows (e.g., $1^{st}$ row, $2^{nd}$ row, etc.) in which they will grow a self-assembling mask that comprises a diblock copolymer, as described in more detail in FIGS. 6A-6L, in accordance with one embodiment.

With reference to FIGS. 6A-6L, formation of a self-aligning diblock copolymer mask is shown according to one embodiment. The diblock copolymer mask may be formed in accordance with the present invention in any of the environments depicted in FIGS. 1-5, among others not specifically described, in various approaches. Of course, more steps, layers, and/or structures may be utilized in the formation of any of the structures and/or layers thereof than those specifically described in FIGS. 6A-6L, as would be understood by one of skill in the art upon reading the present descriptions. In FIGS. 6A-6L, the film thickness direction 602 dictates the usual direction in which layers are formed and/or removed using conventional formation and removal processes known in the art. Moreover, the element width direction 604 is perpendicular to the film thickness direction 602 and is one direction in which an element hay be formed, along with the element depth direction (into the page), which together dictate the cross-sectional area of an element normal to the film thickness direction 602.

Each of the intermediate structures shown in FIGS. 6A-6L may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a central processing circuit (CPU), an application specific integrated circuit (ASIC), a field programmable gate array (FPGA), etc., combinations thereof, or any other suitable computing device known in the art.

In the descriptions of the formation of the various layers in FIGS. 6A-6L, each layer may be formed using any known deposition process, such as sputtering, plating, chemical vapor deposition (CVD), plasma chemical vapor deposition (pCVD), (PECVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

As shown in FIG. 6A, an etch-stop layer 606 is formed. In one embodiment, the etch-stop layer 606 may be formed above a substrate or some other pre-existing structure (such as a prefabrication structure that has buried connections for coupling to one or more pMTJs after formation thereof) in the film thickness direction 602. In one embodiment, the etch-stop layer 606 may comprise a nitride material, such as SiN, or some other suitable material that is resistant to one or more chosen forms of material removal that are known in the art, such as $SiO_2$, $SiON$, $ZrO_2$, $HfO_2$, $Al_2O_3$, etc.

With reference to FIG. 6B, a matrix layer 608 is formed above the etch-stop layer 606 in the film thickness direction 602. In one embodiment, the matrix layer 608 may comprise amorphous silicon (α-Si), or some other suitable layer known in the art that may be used in subsequent operations as a mask layer, but which is also able to be selectively etched and/or removed.

In one embodiment, the matrix layer 608 may have a thickness in a range from about 35 nm to about 65 nm, such as about 50 nm in one embodiment.

With reference to FIG. 6C, a set of pillars 610 is formed above the matrix layer 608 in the film thickness direction 602. As shown, a single pillar 610 is formed, but additional pillars are formed spaced from the shown pillar 610 in the element width direction 604 and in the element depth direction. Each pillar 610 in the set has a predefined spacing from other pillars 610 in the set along a plane that is defined by the element width direction 604 and the element depth direction, the plane being normal to the film thickness direction 602, e.g., across a surface of the matrix layer 608. In one embodiment, each pillar 610 may comprise HSQ or some other suitable material known in the art.

According to one approach, formation of the pillars 610 may be accomplished using electron-beam resist spin coating (to a thickness greater than desired resulting pillar), followed by electron-beam lithography (e.g., 30 kV acceleration voltage, 300 pA beam current, 40 fC-116 fC dot doses) to define each HSQ pillar structure (after development, an option operation may be performed to harden the HSQ via oxygen plasma asher in a further approach).

Each pillar 610 of the set of pillars may have a diameter along the plane in a range from about 15 nm to about 25 nm, such as about 21 nm, and a height in the film thickness direction 602 in a range from about 25 nm to about 40 nm, such as about 33 nm in one embodiment.

According to one approach, the predefined spacing of the set of pillars 610 may include a first spacing in the element depth direction in a range from about 30 nm to about 40 nm, such as about 36 nm in one embodiment, and a second spacing in the element width direction 604 in a range from about 90 nm to about 110 nm, such as about 100 nm in one embodiment. In an alternate embodiment, the second spacing in the element width direction 604 may be in a range from about 290 nm to about 310 nm, such as about 300 nm in the alternate embodiment.

Now referring to FIG. 6D, a functionalization layer 612 is formed above the pillars 610, along sides of the pillars 610, and above the matrix layer 608 in the film thickness direction 602. In one embodiment, the functionalization layer 612 may comprise hydroxyl-terminated-polystyrene (PS) or some other suitable material known in the art that functionalizes the pillars 610 for self-assembly of diblock copolymers thereon.

In a further embodiment, the hydroxyl-terminated-PS may have a molar mass of about 1 kg/mol with a thickness in a range from about 1 nm to about 3 nm, such as about 2 nm in one approach.

With reference to FIG. 6E, first diblock copolymer layers are formed above the functionalization layer 612 in the film thickness direction 602. The first diblock copolymer layers self-segregate into a first polymer 616 and a second polymer 614 in accordance to a first pattern which is at least partially dictated by a ratio of the first polymer 616 to the second polymer 614 in the first diblock copolymer layers. In addition, the positioning of the functionalization layer 612 on the pillars 610 and above the matrix layer 608, along with a periodicity of the location of the pillars 610 (pillar spacing across the surface of the matrix layer 608) aid in the stabilization of phase separation of a bilayer di-block copolymer during the annealing process.

A bilayer diblock copolymer will, under certain processing conditions (e.g., annealing temperature, ramp rate, annealing pressure, annealing time, ambient gases introduced during annealing, diblock copolymer thickness, etc.) form a dual layer structure in which each polymer chain is oriented in a unique way at each vertical level in the film thickness direction.

According to one embodiment, the first diblock copolymer layers may comprise poly(styrene-b-dimethylsiloxane) (PS-b-PDMS). In an alternate embodiment, the first diblock copolymer layers may comprise poly(styrene-b-polymethyl methacrylate) (PS-b-PMMA). Of course, other diblock copolymers known in the art may be used to form the individual segregated blocks above the functionalization layer 612.

In one approach, the first diblock copolymer may be formed via spin coating (e.g., PS-b-PDMS (BCP) at 45.5 kg/mol, $f_{PDMS}$=32%, and a thickness in a range from about 30 nm to about 50 nm, such as about 42 nm in one embodiment).

Now referring to FIG. 6F, the first polymer 616 is removed from the first diblock copolymer layers to create a first mask layer. The first mask layer is a two dimensional mesh along the plane in the element width direction 604 and the element depth direction (into the page) which has a thickness in the film thickness direction 602. The first mask layer has voids therethrough that exist between the crisscrossing strands of the mesh. In one approach, a surface of the second polymer 614 may be oxidized during the removal of the first polymer 616. For example, in a situation where the first polymer 616 is PS, this polymer may be removed via oxygen plasma etching, and during this process, where the second polymer 614 is PDMS, an upper surface thereof will also be oxidized.

According to one embodiment, the first polymer 616 may be PDMS when the first diblock copolymer layers comprise PS-b-PDMS. In an alternate embodiment, the first polymer 616 may be PS from a diblock copolymer of PS-b-PDMS.

In another embodiment, the first polymer 616 may be PMMA when the first diblock copolymer layers comprise PS-b-PMMA. In an alternate embodiment, the first polymer 616 may be PS from a diblock copolymer of PS-b-PMMA.

Figure 6G:
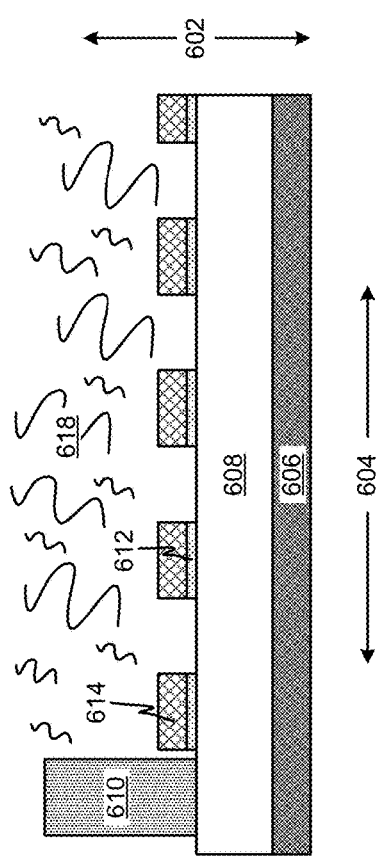

With reference to FIG. 6G, in an optional operation, the first diblock copolymer layers may be annealed 618 using any suitable annealing process known in the art. In one embodiment, after formation of the first mask layer, heat annealing may be applied (e.g., about 170° C. for about 72 hours) to form a self-aligned structure using a thermodynamically driven process. In an alternate or complimentary embodiment, other annealing techniques may be used, such as to speed up the annealing process. For example, other annealing techniques may include solvent vapor annealing (e.g., about 2 hours in acetone vapor or some other suitable solvent known in the art), microwave annealing (e.g., microwave power of about 100 W for about 60 seconds at about 323K), etc.

Figure 6H:
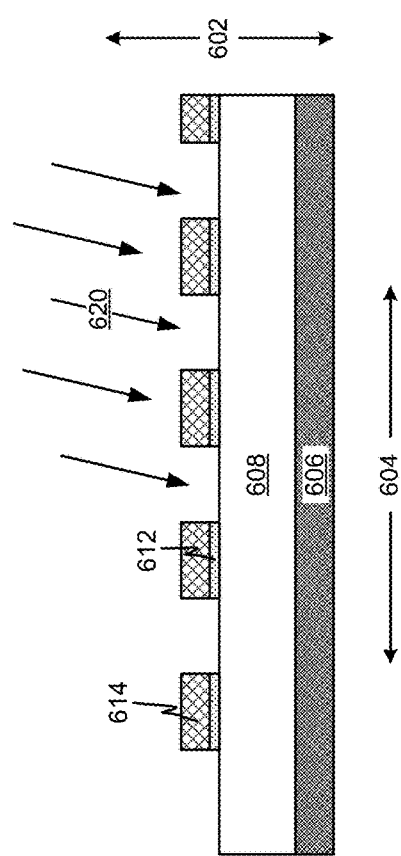

In another operation, as shown by the transition from FIG. 6G to FIG. 6H, the pillars 610 may be removed prior to or after creating the first mask layer.

Now referring to FIG. 6H, portions of the matrix layer 608 that are not covered by the first mask layer in the film thickness direction 602 are removed to expose portions of the etch-stop layer 606 positioned therebelow and create a second pattern in the matrix layer 608 that forms a second mask layer 622, as shown in FIG. 6I. Thereafter, the first mask layer is removed via a material removal process known in the art. In one embodiment, the first mask layer may be removed via a material release procedure, such as ultraviolet light (UV) to release oxides, etc.

With reference to FIG. 6J, second diblock copolymer layers are formed on sides of the second mask layer 622 and above the second mask layer 622 in the film thickness direction 602. The second diblock copolymer layers self-segregate into a third polymer 626 that is formed on the sides of the second mask layer 622 and above the second mask layer 622 and a fourth polymer 624 that is formed in holes of the second mask layer 622 above the etch-stop layer 606.

In one approach, the second diblock copolymer layers may comprise poly(styrene-b-polymethyl methacrylate) (PS-b-PMMA). In addition, the third polymer 626 may be PS according to one approach.

Now referring to FIG. 6K, the fourth polymer 624 and portions of the etch-stop layer 606 positioned therebelow in the film thickness direction 602 that are not covered by the second mask layer 622 and a portion of the third polymer 626 that is formed on the sides of the second mask layer 622 are removed, such as via etching 620 in one embodiment, to form a plurality of contact holes 628 through the etch-stop layer in a third pattern, as shown in FIG. 6L.

In a further embodiment, each of the contact holes 628 may have a substantially cylindrical shape with a circular cross-section along the plane in the element width direction 604 and the element depth direction (into the page). Moreover, a diameter of each of the plurality of contact holes 628 formed through the etch-stop layer 606 may be controlled by a thickness of the third polymer 626 formed on sides of the second mask layer 622.

In accordance with a further embodiment, a plurality of pMTJ stacks may be formed in and using the plurality of contact holes 628 as guides for the stacks according to the third pattern.

Figure 7:
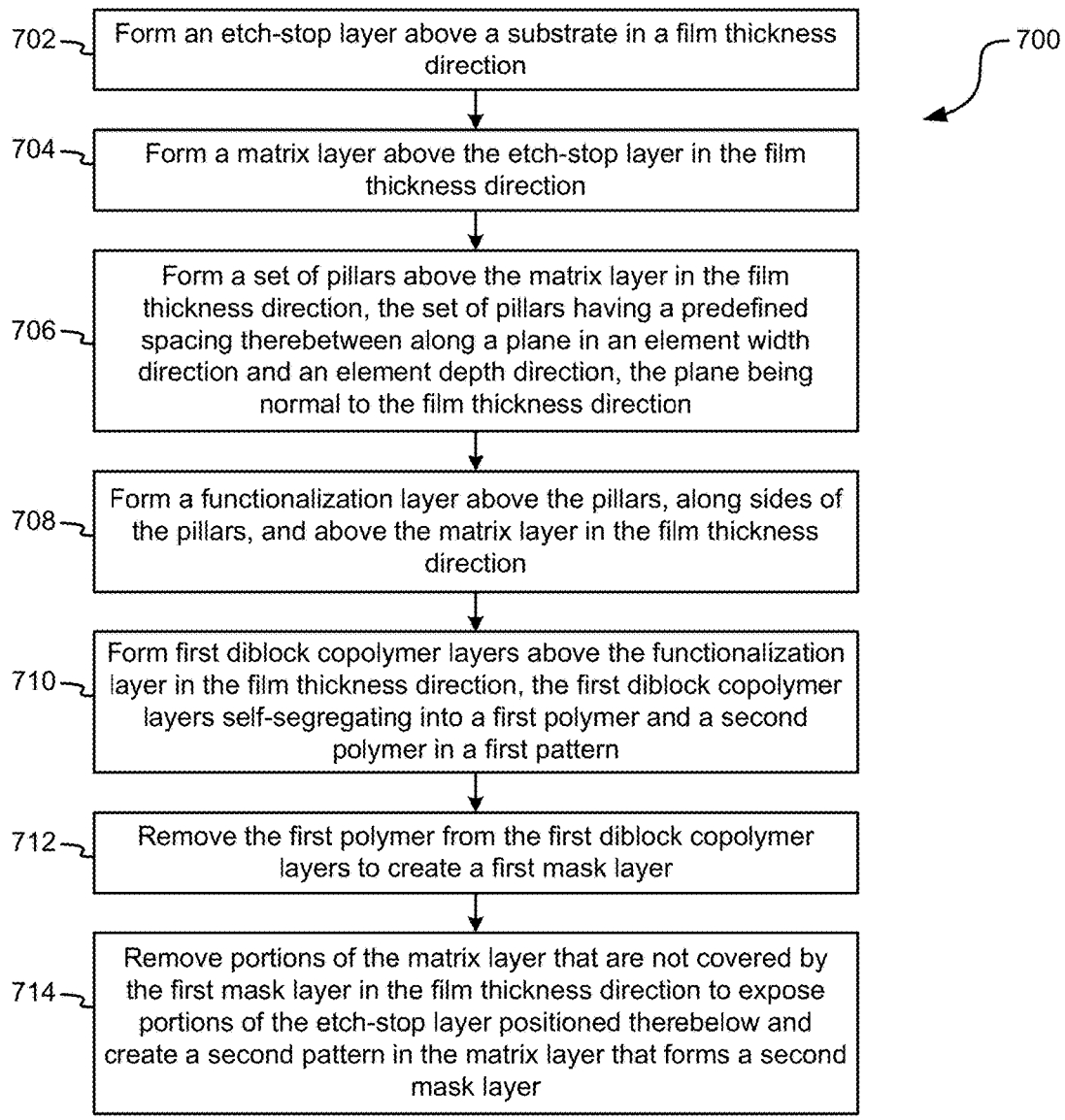
FIG. 7 shows a flowchart of a method, in accordance with one embodiment.

Now referring to FIG. 7, a method 700 is shown according to one embodiment. The method 700 may be performed in accordance with the present invention in any of the environments depicted in FIGS. 1-6L, among others not specifically described, in various approaches. Of course, more or less operations than those specifically described in FIG. 7 may be included in method 700, as would be understood by one of skill in the art upon reading the present descriptions.

Each of the operations of method 700 may be performed by any suitable component of the operating environment. For example, in various embodiments, method 700 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 700. Illustrative processing circuits include, but are not limited to, a CPU, an ASIC, a FPGA, etc., combinations thereof, or any other suitable computing device known in the art.

In the descriptions of method 700 in FIG. 7, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Referring now to FIG. 7, method 700 may begin with operation 702 where an etch-stop layer is formed above a substrate in a film thickness direction.

In operation 704, a matrix layer is formed above the etch-stop layer in the film thickness direction.

In operation 706, a set of pillars are formed above the matrix layer in the film thickness direction, the set of pillars having a predefined spacing therebetween along a plane in an element width direction and an element depth direction. The plane is normal to the film thickness direction.

In operation 708, a functionalization layer is formed above the pillars, along sides of the pillars, and above the matrix layer in the film thickness direction.

In operation 710, first diblock copolymer layers are formed above the functionalization layer in the film thickness direction, the first diblock copolymer layers self-segregating into a first polymer and a second polymer in a first pattern.

In operation 712, the first polymer from the first diblock copolymer layers is removed to create a first mask layer.

In operation 714, portions of the matrix layer that are not covered by the first mask layer in the film thickness direction are removed to expose portions of the etch-stop layer positioned therebelow and create a second pattern in the matrix layer that forms a second mask layer.

Method 700 may further include, in some embodiments, forming second diblock copolymer layers are formed on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer.

Moreover, method 700 may also include removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

In one embodiment, each of the contact holes may have a substantially cylindrical shape with a circular cross-section along the plane in the element width direction and the element depth direction. Moreover, a diameter of each of the plurality of contact holes formed through the etch-stop layer may be controlled by a thickness of the third polymer formed on sides of the second mask layer. Also, the second diblock copolymer layers may comprise PS-b-PMMA.

In another embodiment, the first polymer may be PDMS, the third polymer may be PS, and the matrix layer may have a thickness in a range from about 35 nm to about 65 nm. Also, the functionalization layer may have a thickness in a range from about 1 nm to about 3 nm.

Method 700 may also include removing the pillars prior to creating the first mask layer, annealing the first diblock copolymer layers prior to creating the first mask layer, oxidizing a surface of the second polymer prior to creating the first mask layer, and forming a plurality of pMTJ stacks in the plurality of contact holes according to the third pattern.

In a specific embodiment, the substrate may comprise Si, the etch-stop layer may comprise a nitride material, the matrix layer may comprise $\alpha$-Si, the functionalization layer may comprise hydroxyl-terminated PS, each of the set of pillars may comprise HSQ, and the first diblock copolymer layers may comprise PS-b-PDMS.

According to yet another embodiment, each pillar of the set of pillars may have a diameter of about 21 nm and a height of about 33 nm, and the predefined spacing of the set of pillars may include a first spacing in the element depth direction of about 36 nm and a second spacing in the element width direction of about 100 nm or about 300 nm.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method, comprising:
   forming an etch-stop layer above a substrate in a film thickness direction;
   forming a matrix layer above the etch-stop layer in the film thickness direction;
   forming a set of pillars above the matrix layer in the film thickness direction, the set of pillars having a predefined spacing therebetween along a plane in an element width direction and an element depth direction, the plane being normal to the film thickness direction;
   forming a functionalization layer above the pillars, along sides of the pillars, and above the matrix layer in the film thickness direction;
   forming first diblock copolymer layers above the functionalization layer in the film thickness direction, the first diblock copolymer layers self-segregating into a first polymer and a second polymer in a first pattern;

removing the first polymer from the first diblock copolymer layers to create a first mask layer; and removing portions of the matrix layer that are not covered by the first mask layer in the film thickness direction to expose portions of the etch-stop layer positioned therebelow and create a second pattern in the matrix layer that forms a second mask layer.

2. The method as recited in claim 1, further comprising:

forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer; and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

3. The method as recited in claim 2, wherein each of the contact holes have a substantially cylindrical shape with a circular cross-section along the plane in the element width direction and the element depth direction.

4. The method as recited in claim 3, wherein a diameter of each of the plurality of contact holes formed through the etch-stop layer is controlled by a thickness of the third polymer formed on sides of the second mask layer, and wherein the second diblock copolymer layers comprise poly(styrene-b-polymethyl methacrylate) (PS-b-PMMA).

5. The method as recited in claim 4, wherein the first polymer is PDMS, wherein the third polymer is PS, wherein the matrix layer has a thickness in a range from about 35 nm to about 65 nm, and wherein the functionalization layer has a thickness in a range from about 1 nm to about 3 nm.

6. The method as recited in claim 2, further comprising:
removing the pillars prior to creating the first mask layer;
annealing the first diblock copolymer layers prior to creating the first mask layer;
oxidizing a surface of the second polymer prior to creating the first mask layer; and
forming a plurality of perpendicular magnetic tunnel junction (pMTJ) stacks in the plurality of contact holes according to the third pattern.

7. The method as recited in claim 1,
wherein the substrate comprises Si,
wherein the etch-stop layer comprises a nitride material,
wherein the matrix layer comprises amorphous silicon (α-Si),
wherein the functionalization layer comprises hydroxyl-terminated polystyrene (PS),
wherein each of the set of pillars comprises hydrogen silsesquioxane (HSQ), and
wherein the first diblock copolymer layers comprise poly(styrene-b-dimethylsiloxane) (PS-b-PDMS).

8. The method as recited in claim 1, wherein each pillar of the set of pillars has a diameter of about 21 nm and a height of about 33 nm, and wherein the predefined spacing of the set of pillars comprises a first spacing in the element depth direction of about 36 nm and a second spacing in the element width direction of about 100 nm or about 300 nm.

9. The method as recited in claim 1, wherein forming each of the pMTJs comprises:

forming a seed layer above a corresponding electrode in the film thickness direction;

forming an underlayer above the seed layer in the film thickness direction;

forming a synthetic antiferromagnetic (SAF) seed layer above the underlayer in the film thickness direction;

forming a first SAF layer above the SAF seed layer in the film thickness direction;

forming a spacer layer above the first SAF layer in the film thickness direction;

forming an antiferromagnetic (AFM) coupling layer above the spacer layer in the film thickness direction;

forming a second SAF layer above the AFM coupling layer in the film thickness direction;

forming a ferromagnetic (FM) coupling layer above the second SAF layer in the film thickness direction;

forming a reference layer above the FM coupling layer in the film thickness direction;

forming a barrier layer above the reference layer in the film thickness direction;

forming a free layer above the barrier layer in the film thickness direction; and forming at least one cap layer above the free layer in the film thickness direction.

10. A method, comprising:

forming an etch-stop layer above a substrate in a film thickness direction;

forming a matrix layer above the etch-stop layer in the film thickness direction;

forming a set of pillars above the matrix layer in the film thickness direction, the set of pillars having a predefined spacing therebetween along a plane in an element width direction and an element depth direction, the plane being normal to the film thickness direction;

forming a functionalization layer above the pillars, along sides of the pillars, and above the matrix layer in the film thickness direction;

forming first diblock copolymer layers above the functionalization layer in the film thickness direction, the first diblock copolymer layers self-segregating into a first polymer and a second polymer in a first pattern;

annealing the first diblock copolymer layers;

removing the first polymer from the first diblock copolymer layers to create a first mask layer;

removing the pillars;

removing portions of the matrix layer that are not covered by the first mask layer in the film thickness direction to expose portions of the etch-stop layer positioned therebelow and create a second pattern in the matrix layer that forms a second mask layer;

forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer; and removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

11. The method as recited in claim 10, wherein each of the contact holes have a substantially cylindrical shape with a circular cross-section along the plane in the element width direction and the element depth direction.

12. The method as recited in claim 11, wherein a diameter of each of the plurality of contact holes formed through the etch-stop layer is controlled by a thickness of the third polymer formed on sides of the second mask layer.

13. The method as recited in claim 10, further comprising:
    oxidizing a surface of the second polymer prior to creating the first mask layer; and
    forming a plurality of perpendicular magnetic tunnel junction (pMTJ) stacks in the plurality of contact holes.

14. The method as recited in claim 10,
    wherein the substrate comprises Si,
    wherein the etch-stop layer comprises a nitride material,
    wherein the matrix layer comprises amorphous silicon (α-Si),
    wherein the functionalization layer comprises hydroxyl-terminated polystyrene (PS),
    wherein each of the set of pillars comprises hydrogen silsesquioxane (HSQ),
    wherein the first diblock copolymer layers comprise poly(styrene-b-dimethylsiloxane) (PS-b-PDMS), and
    wherein the second diblock copolymer layers comprise poly(styrene-b-polymethyl methacrylate) (PS-b-PMMA).

15. The method as recited in claim 14, wherein the first polymer is PDMS, wherein the third polymer is PS, wherein the matrix layer has a thickness in a range from about 35 nm to about 65 nm, and wherein the functionalization layer has a thickness in a range from about 1 nm to about 3 nm.

16. The method as recited in claim 10, wherein each pillar of the set of pillars has a diameter of about 21 nm and a height of about 33 nm, and wherein the predefined spacing of the set of pillars comprises a first spacing in the element depth direction of about 36 nm and a second spacing in the element width direction of about 100 nm or about 300 nm.

17. A method, comprising:
    forming an etch-stop layer above a substrate in a film thickness direction;
    forming a matrix layer above the etch-stop layer in the film thickness direction;
    forming a set of pillars above the matrix layer in the film thickness direction, the set of pillars having a predefined spacing therebetween along a plane in an element width direction and an element depth direction, the plane being normal to the film thickness direction;
    forming a functionalization layer above the pillars, along sides of the pillars, and above the matrix layer in the film thickness direction;
    forming first diblock copolymer layers above the functionalization layer in the film thickness direction, the first diblock copolymer layers self-segregating into a first polymer and a second polymer in a first pattern, wherein the first diblock copolymer layers comprise poly(styrene-b-dimethylsiloxane) (PS-b-PDMS), the first polymer being PDMS;
    removing the first polymer from the first diblock copolymer layers to create a first mask layer;
    removing portions of the matrix layer that are not covered by the first mask layer in the film thickness direction to expose portions of the etch-stop layer positioned therebelow and create a second pattern in the matrix layer that forms a second mask layer;
    forming second diblock copolymer layers on sides of the second mask layer and above the second mask layer in the film thickness direction, the second diblock copolymer layers self-segregating into a third polymer that is formed on the sides of the second mask layer and above the second mask layer and a fourth polymer that is formed in holes of the second mask layer above the etch-stop layer, wherein the second diblock copolymer layers comprise poly(styrene-b-polymethyl methacrylate) (PS-b-PMMA), the third polymer being PS; and
    removing the fourth polymer and portions of the etch-stop layer positioned therebelow in the film thickness direction that are not covered by the second mask layer and a portion of the third polymer that is formed on the sides of the second mask layer to form a plurality of contact holes through the etch-stop layer in a third pattern.

18. The method as recited in claim 17, wherein each of the contact holes have a substantially cylindrical shape with a circular cross-section along the plane in the element width direction and the element depth direction, wherein a diameter of each of the plurality of contact holes formed through the etch-stop layer is controlled by a thickness of the third polymer formed on sides of the second mask layer, and wherein the matrix layer has a thickness in a range from about 35 nm to about 65 nm, and wherein the functionalization layer has a thickness in a range from about 1 nm to about 3 nm.

19. The method as recited in claim 17, further comprising:
    removing the pillars prior to creating the first mask layer;
    annealing the first diblock copolymer layers prior to creating the first mask layer;
    oxidizing a surface of the second polymer prior to creating the first mask layer; and
    forming a plurality of perpendicular magnetic tunnel junction (pMTJ) stacks in the plurality of contact holes according to the third pattern.

20. The method as recited in claim 17,
    wherein the substrate comprises Si,
    wherein the etch-stop layer comprises a nitride material,
    wherein the matrix layer comprises amorphous silicon (α-Si),
    wherein the functionalization layer comprises hydroxyl-terminated polystyrene (PS),
    wherein each of the set of pillars comprises hydrogen silsesquioxane (HSQ), and
    wherein each pillar of the set of pillars has a diameter of about 21 nm and a height of about 33 nm, and
    wherein the predefined spacing of the set of pillars comprises a first spacing in the element depth direction of about 36 nm and a second spacing in the element width direction of about 100 nm or about 300 nm.

* * * * *